United States Patent [19]

Krause et al.

[11] 4,097,732

[45] Jun. 27, 1978

[54] AUTOMATIC GAIN CONTROL FOR PHOTOSENSING DEVICES

[75] Inventors: Thomas R. Krause, Troy; Eugene E. Paananen, Brighton; John F. Burcz, Detroit, all of Mich.

[73] Assignee: Burroughs Corporation, Detroit, Mich.

[21] Appl. No.: 802,711

[22] Filed: Jun. 2, 1977

[51] Int. Cl.² .............................................. G01J 1/32
[52] U.S. Cl. ............................. 250/205; 250/214 AG; 250/214 B; 356/205
[58] Field of Search ............ 250/214 B, 214 AG, 205; 356/205

[56] References Cited
U.S. PATENT DOCUMENTS 3,297,904  1/1967  Lauxen ................................ 250/205
3,721,963  3/1973  Jenne .................................. 250/205

Primary Examiner—M. Tokar
Attorney, Agent, or Firm—Robert C. J. Tuttle; Carl Fissell, Jr.; Kevin R. Peterson

[57] ABSTRACT

A beam-of-light (BOL) sensor having means for regulating the intensity of the sensor light source to compensate for extraneous factors in its operating environment, e.g., dust accumulation, component aging, misalignment, etc., that may affect consistent sensor operation. The BOL sensor includes a photosensor whose output signal is compared against a reference signal to determine if the light source intensity is of the proper level. The comparison signal is used to gate clock pulses to a counter to adjust its stored count upward or downward, dependent on whether the light source intensity is low or high, respectively. A filter is provided to override interruptions in the photosensor output signal below a predetermined minimum time duration.

10 Claims, 9 Drawing Figures

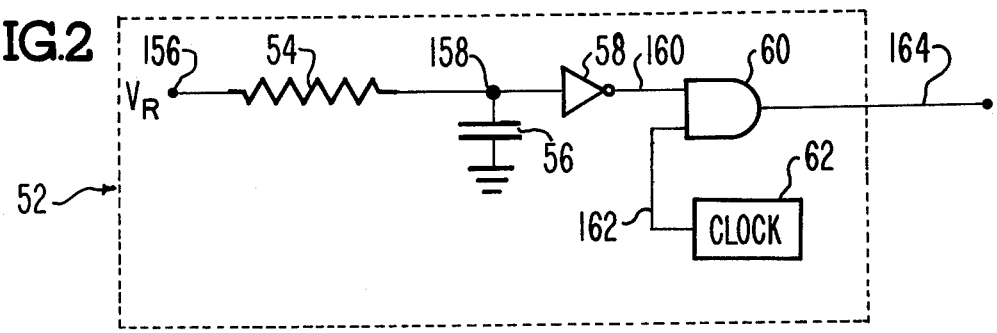
FIG.2
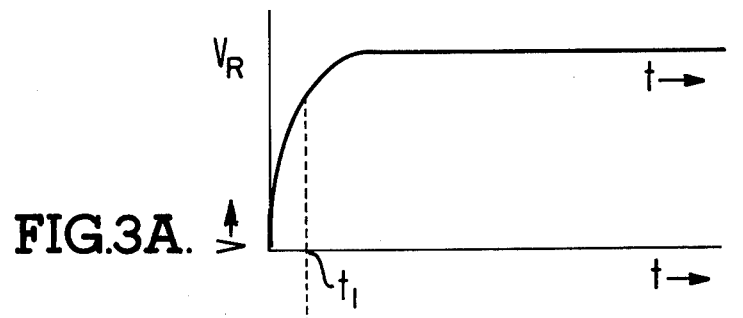
FIG.3.
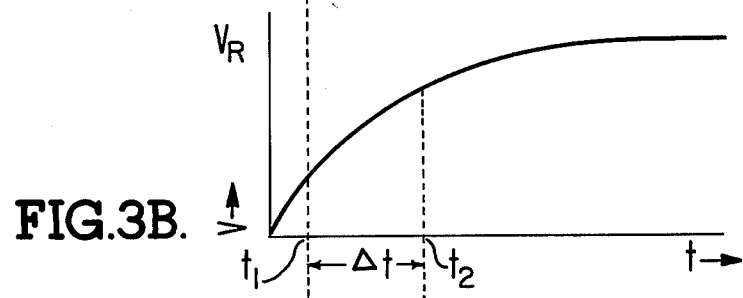
FIG.3A.
FIG.3B.
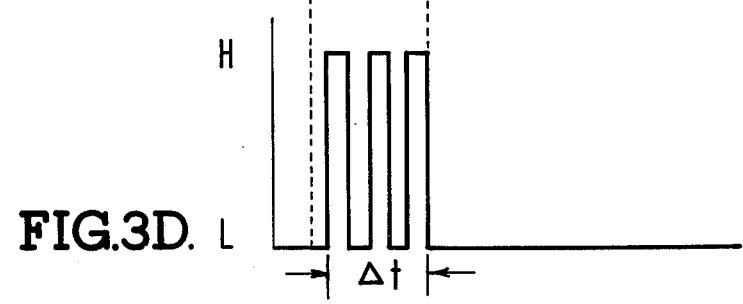
FIG.3C.
FIG.3D.

AUTOMATIC GAIN CONTROL FOR PHOTOSENSING DEVICES

BACKGROUND OF THE INVENTION

1. Field of the Invention

The present invention relates to optical sensors, and more particularly to a beam-of-light sensor incorporating means for compensating irregularities in the intensity of the sensor light source.

2. Description of the Prior Art

Beam-of-light (BOL) sensors are used in applications where it is necessary to know when an object, e.g., a document, passes through a certain point and to provide a signal indicative thereof.

A BOL sensor commonly includes a light source whose beam is directed at the position at which the object is to be sensed. A light sensitive transducer, such as a phototransistor, is mounted in aligned relationship with the light source. When the BOL sensor is used in the direct mode, the light transducer will be responsive to an interruption of the light incident upon it by the interposition of the sensed object between the light source and phototransistor. When used in the reflective mode, the light transducer will be responsive to the incidence of light upon it that is reflected off the sensed object.

In practical application, the BOL sensor components are subject to extraneous influences in the operating environment that affect sensor performance. For example, when the BOL sensor is used in document detection, there is an ever present problem of dust accumulation upon the windows of the light source and the light transducer. Additionally, each of the components may age and operate at variance with its design specifications.

One solution to the problem is to schedule frequent preventive maintenance periods to physically clean the sensor and test its performance level. However, this is costly in terms of personnel time and increases down time of the machine. A second, more desirable solution would be to design a BOL sensor that includes self-compensating means to adapt the output of the light source to compensate for any factors impairing normal sensor operation. A practicable implementation of the second solution is a primary objective of the present invention.

BRIEF SUMMARY OF THE INVENTION

The present invention is a beam-of-light sensor unit including means for adapting to extraneous influences in its operating environment. More specifically, the BOL sensor is set to operate at a predetermined performance level, and when its operation departs from that performance level, such departures are sensed and compensated for by adjusting the operating parameters of the associated light source.

Broadly, the BOL sensor includes a light source and a phototransducer that is mounted in aligned relation with the source and responsive to the incidence of light thereon. When there is no object in the path of the light source, the phototransducer output is taken and compared against a reference output level. An error signal is generated dependent upon whether the output is high or low. A stored count is adjusted in accordance with the polarity of the error signal and then fed back through a digital to analog converter to regulate the drive current to the light source.

More specifically, the stored count is adjusted at a periodic rate in accordance with the output of a source of clock pulses. Each clock pulse will effect a unitary adjustment to the stored count in accordance with the polarity of the error signal. An interlock is provided to disable adjustment of the stored count whenever an object is interposed between the light source and phototransducer. The interlock feature is a safeguard against running up the stored count in the event of a jam or similar type abnormality.

A further feature of the invention is the provision of a hole filter in the object detection portion of the circuitry. The hole filter serves to filter out minor transparencies below a predetermined minimum duration to prevent double detection for a single object.

Other advantages of the present invention will be readily appreciated as the same becomes better understood by reference to the following detailed description when considered in connection with the accompanying drawings.

BRIEF DESCRIPTION OF THE DRAWING

FIG. 2 is a schematic representation of the initialization circuit of FIG. 1 used to preset the stored count;

FIGS. 3A–3D shows time plots of the various signal outputs in the circuit of FIG. 2;

Detailed Description of a Specific Embodiment

Figure 1:
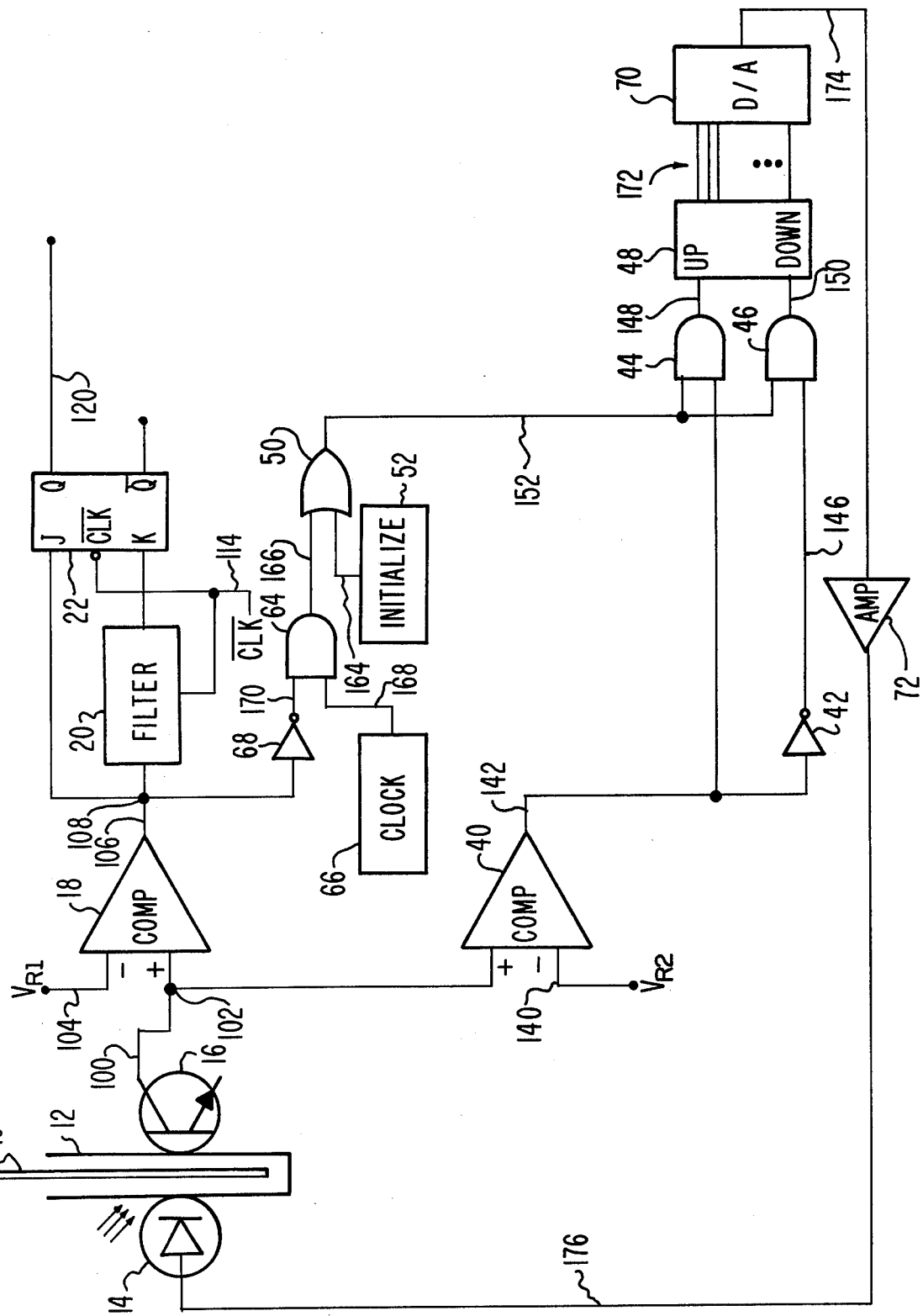
FIG. 1 is a schematic illustration of the beam-of-light sensor of the present invention.

FIG. 1 is a schematic representation of a beam-of-light (BOL) sensor incorporating an automatic gain control circuit of the present invention. The BOL sensor comprises a light source, such as a light emitting diode (LED) 14, and a light responsive transducer, such as a phototransistor (PT) 16. The LED 14 and PT 16 are mounted in aligned relationship with one another on the walls of a transport track 12 to detect the passing of a document 10 through a sensing station defined by the path of light communication between the LED and PT.

When a document is interposed between the LED 14 and PT 16, the communication of light therebetween is interrupted, and the PT is cut off, causing the collector lead 100 to go high. Conversely, when a document is absent from the sensing station, light is in communication between the LED 14 and PT 16 and the PT is in saturation, causing the collector lead 100 to go low.

The signal off the collector lead 100, whose level relates to the presence or non-presence of a document in the sensing station, is branched off into first and second paths at node 102. The primary function of the first upper path is to develop an output signifying the presence or non-presence of a document in the sensing station. The primary function of the second, lower, closed-loop path is to stabilize the operation of the BOL by regulating the drive current to the PT 14. Each of the paths will be more specifically discussed as follows.

The first path develops an output signifying the presence or non-presence of the document in the sensing station based on the signal level on the collector lead 100. The collector signal is input from the upper branch of the node 102 into a comparator 18. The second input to the comparator on line 104 is a threshold-defining reference voltage, $V_{R1}$. Should the collector signal level on line 100 exceed the reference signal on line 104, the output of the comparator will be high. Conversely, should $V_{R1}$ exceed the collector signal level, the comparator output level will be low.

The output of comparator 18 on line 106 divides into three branches out of node 108. One branch is input to a filter 20 whose function is to filter out or override interruptions in the output of the comparator that are below a predetermined minimum time duration. These minor interruptions may be caused by spurious transparencies in the document 10, such as a staple hole or the like, and could otherwise allow the detection signal for a single document passing through the sensing station to be interpreted as a plurality of smaller, distinct documents. The signal on line 106 is similarly provided to the J input of a J-K flip flop or latch 22. The latch 22 operates in conjunction with the filter 20 to provide the document detection output signal of the first path, as will now be more fully discussed.

Figure 4:
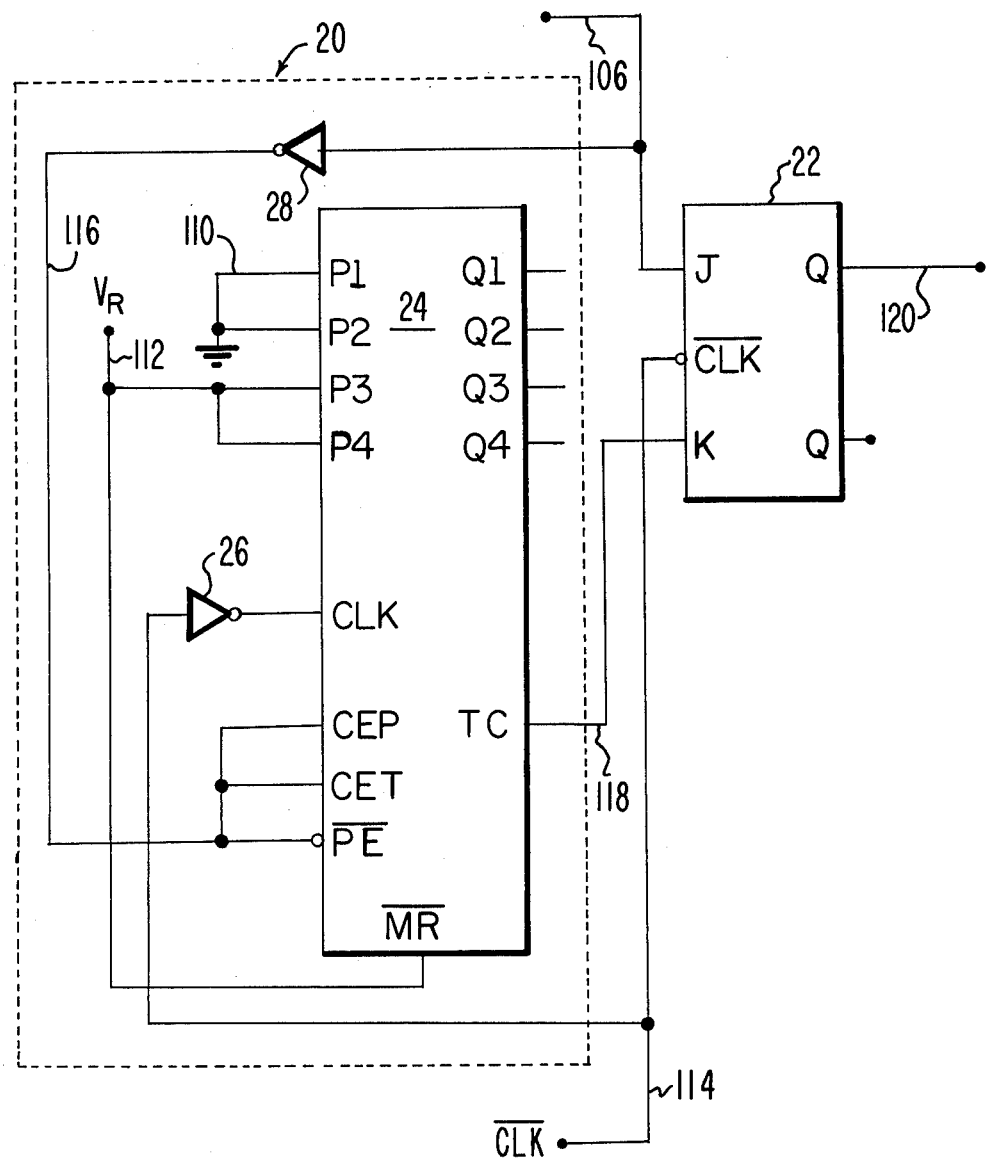
FIG. 4 is a schematic illustration of the conjunctive hole filter and latch in the document detection path of FIG. 1.

Referring to FIG. 4, the filter 20 is more fully represented by the structure contained within the dashed lines. The primary component of the filter is a four-bit binary counter 24, such as a TTL SN74LS161. The binary counter 24 has four data input terminals P1, P2, P3 and P4, representing the 1, 2, 4 and 8 bit positions, respectively. There are three control input signals, CEP, CET and PE/ (the virgule symbol is hereinafter used to denote the inverted mode). The PE/ control input enables parallel loading of the data inputs. The CET (count enable trickle) input allows the carry bit of the counter to be enabled when high. The CEP (count enable parallel) allows the counter to count upon the receipt of a clock signal when high. A clock input (CLK) is provided through line 114 from an inverted clock source CLK/ and reinverted through an inverter 26.

The counter 24 has four data output terminals Q1, Q2, Q3 and Q4, each representing the 1, 2, 4 and 8 bit positions respectively. A carry bit is output on terminal TC. A master reset MR/ is provided to clear the counter for subsequent operation.

The four data inputs P1, P2, P3 and P4 are all preloaded. Specifically, P1 and P2 are tied together to ground through line 110. P3 and P4 are tied together and held high at a reference voltage $V_R$, nominally high volts, through line 112. Similarly, the MR/ input is constantly held high to prevent the counter from clearing. The effect of holding the four data inputs at predetermined levels in the manner indicated is to load a 12 count into the counter when counting is enabled.

Figure 5:
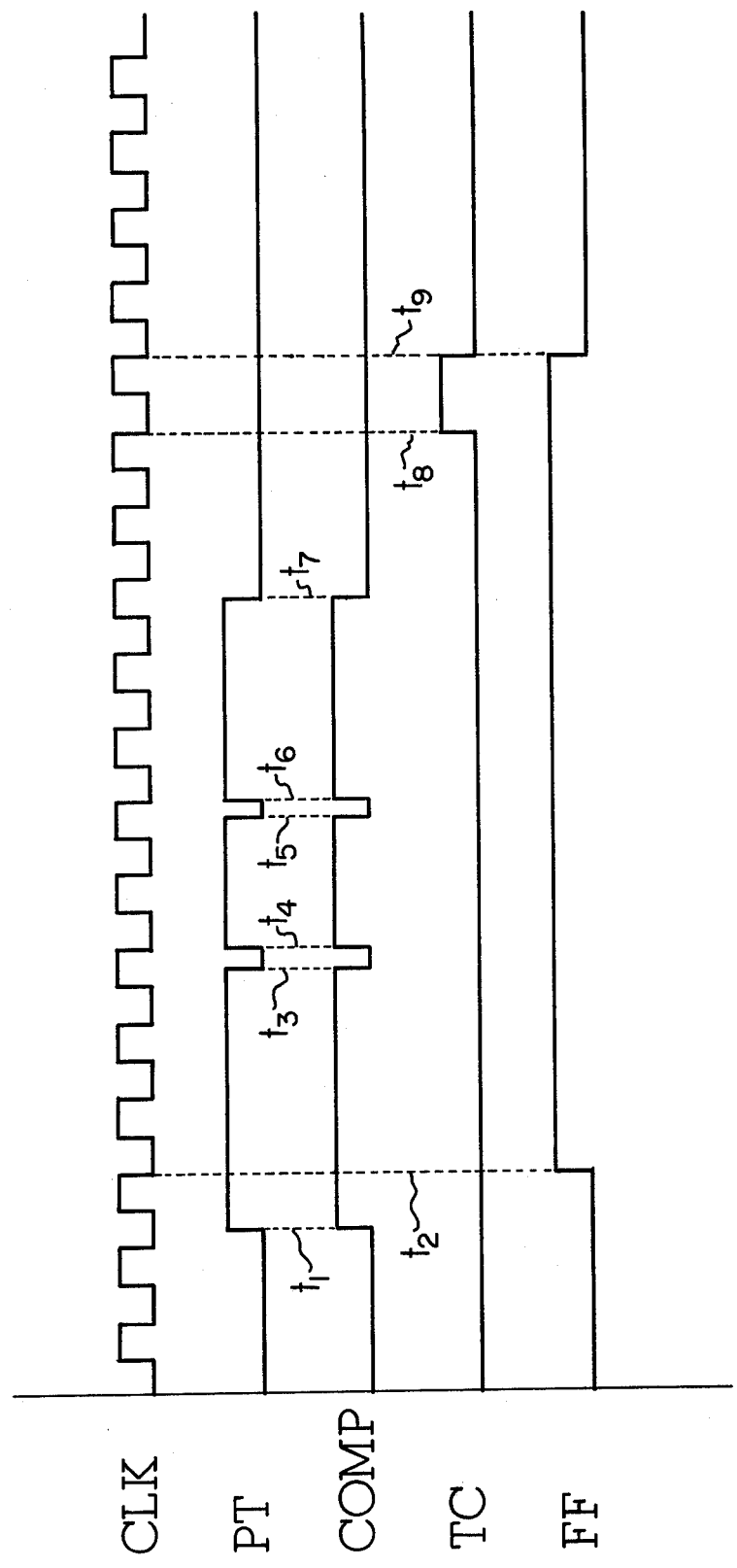
FIG. 5 is a timing diagram for the system illustrated in FIGS. 1, 2 and 4.

The three control inputs, PE/, CET and CEP are all tied together and receive their input signal on line 116. The signal on line 116 is the direct inversion of the input on line 106, by means of an inverter 28. Accordingly, when the signal level on the curve labeled COMP of FIG. 5 is high, the input signal on line 116 is low. In this instance, the CEP input and CET inputs are disabled. On the other hand, the PE/ input is enabled allowing the counter to load a data signal on P1, P2, P3 and P4, i.e., a 12. Conversely, when the signal on the COMP curve of FIG. 5 is low, the input signal on line 116 is high, disabling the PE/ terminal and enabling the CET and CEP terminals. The enablement of the CEP terminal allows the counter to count up one unit with each clock pulse. The enablement of the CET terminal allows a carry bit to be output on terminal TC. The data output terminals Q1, Q2, Q3 and Q4 are not needed in this application and are allowed to float.

Considering now the specific signal on the COMP curve of FIG. 5, the leading edge of the document occurs at time $t_1$ and causes the signal on line 116 to go low. This low signal disables CEP and CET, while enabling PE/. For as long as the control input signal is low, the counter will repetitively load the data inputs on P1, P2, P3 and P4 with each clock pulse.

At time $t_3$, the leading edge of a spurious hole will cause the control signal on line 116 to go low and remain low until the trailing edge of the hole at time $t_4$. However, unless the time duration of the hole is of sufficient length to enable the counter 24 to count through three clock pulses, the count will simply reset at 12 and leave the TC output 118 unchanged, effectively ignoring or filtering out the hole. In a similar manner, the short glitch appearing between times $t_5$ and $t_6$ will also be filtered out.

At time $t_7$, the actual trailing edge of the document occurs and a downward transition takes place in the signal level on line 106. Accordingly, the control signal on line 116 goes high, disabling the PE/ control input and enabling the CET and CEP control inputs. The signal on line 116 will remain high until another document is detected. With the enablement of the CEP input, the counter 24 will count up one unit with each clock pulse beginning at the preloaded level of 12. With the enablement of the CET input, a carry bit will appear at the TC output 118 when the counter reaches 15, i.e., three clock pulses later as indicated by $t_8$ on the TC curve of FIG. 5. The TC output 118 will remain high for one clock pulse and then return low as indicated at time $t_9$. In short, the filter 20 will ignore or filter out spurious holes in the document by means of a three clock delay.

The J input of the J-K flip flop 22 similarly receives the COMP signal of FIG. 5. The flip flop 22 (FF in FIG. 5) is set at time $t_2$, which is on the downward transition of the first clock pulse following time $t_1$. The flip flop 22 remains set until time $t_9$, which represents the first downward transition of a clock pulse following a high input signal to the K input of the flip flop. The Q output curve of the flip flop serves as a close approximation to the time the document 10 is actually in the sensing station. It is free of interruptions from spurious transparencies in the document, and subject only to a three clock pulse delay at its trailing edge.

The second, closed loop path branching off node 102 is used to regulate the intensity of the LED 14 to compensate for extraneous influences in the BOL sensor operating environment.

The second path is initiated by inputting the collector lead signal level 100 into a comparator 40. The other input to the comparator 40 is a reference voltage $V_{R2}$ which represents the desired collector signal level when no document is present in the sensing station. If the signal level on collector lead 100 exceeds the reference voltage level, $V_{R2}$, the output level of the comparator 40 will go high, indicating that the intensity of the LED 14 is below the desired level. Conversely, if the reference voltage level $V_{R2}$ exceeds the signal level on collector lead 100, the output level of the comparator 40 will be low, indicating that the intensity of the LED 14 is above the desired level.

The output signal 142 of the comparator 40 branches off into two paths from node 144. The first path is an asserted representation of comparator output signal 142, and is supplied as one input to an AND gate 44. The second path branching off from node 144 is input to an inverter 42. The output of the inverter 146 is similarly provided as one input to another AND gate 46. Accordingly, when the output of the comparator 40 is high, indicating that the intensity of the LED 14 is below its desired level, AND gate 44 will receive an enabling input signal, and AND gate 46 will receive a disabling input signal. Conversely, when the output of comparator 40 is low, indicating that the intensity of the LED 14 is above its desired level, the AND gate 46 will receive an enabling input signal and the AND gate 44 will receive a disabling input signal.

Each of the AND gates 44 and 46 are input to an up/down counter 48; the output 148 of AND gate 44 is provided to the UP input of the counter, and the output 150 of AND gate 146 is provided to the DOWN input of the counter 48. The up/down counter 48 stores an adjustable count that can be adjusted upward or downward by a pulse on lines 148 and 150, respectively. The stored count has a corresponding relationship to the intensity of the LED 14 as will hereinafter be more fully discussed.

The counter 48 is initialized by means of an initialization circuit 52 which supplies a burst of pulses of predetermined number to initially load the counter 48. The output 164 of the initialization circuit 52 is gated through OR gate 50 on line 152. The signal on line 152 is input to AND gates 44 and 46 alike. AND gate 44 will generally be open to pass the initialization pulses to the UP input of the counter 48, as the output of the comparator 40 will be high during this initialization stage. The initialization circuit will presently be discussed in greater detail.

With reference to FIG. 2, the initialization circuit 52 is shown contained within the dashed lines. The circuit comprises a series R-C network, including a resistor 54 and capacitor 56. The resistor 54 is energized at terminus 156 by a reference voltage $V_R$, nominally 5 volts. The output of the R-C network is taken at node 158 and provided as input to an inverter 58. The output of the inverter 58 is provided on line 162 to AND gate 60. The second input to the AND gate 60 is provided on line 162 as the output of a free-running clock 62.

The reference voltage, $V_R$, may be assumed to have a rise time, $t_1$, which represents the time it takes the voltage source to become operational after being switched on. FIG. 3A is a graphic representation of the rise time, $t_1$.

After the reference voltage has become operational, the capacitor 56 begins to charge up. In FIG. 3B, the time at which the capacitor 56 is charged up to a logically high level is represented by time $t_2$. For the time interval between $t_1$ and $t_2$ designated as delta $t$ in FIG. 3B, the signal level at node 158 is low. During this time interval delta $t$, the input to comparator 58 will be low, causing its output 160 to be high. The output 160 of comparator 58 is graphically represented in FIG. 3C.

Accordingly, while the signal on line 160 is high during the time interval delta $t$, the AND gate 60 will be open to receive the pulses from the clock 62 on line 162. The output of AND gate 60 on line 164 is illustrated in FIG. 3D. A plurality of clock pulses are gated through AND gate 60 to be eventually communicated to the up/down counter 48 for initialization of the counter. The number of clock pulses is dependent upon the parameters selected for the R-C network.

Once the up/down counter 48 has been initialized, it may be kept current in operation by regular adjustment of its count, as will now be discussed.

With reference to FIG. 1, the OR gate 50 has a second input 166 from an AND gate 64. The AND gate has a first input on line 170 which is the inverted representation, via inverter 68, of the output signal 106 of the first comparator 18. In other words, the signal 170 is essentially in an inverted representation of the document detection signal hereinbefore discussed in describing the first path branching from node 102. The signal on line 170 will effectively close AND gate 164 whenever the output 106 of comparator 18 signifies the presence of a document in the sensing station.

The second input to AND gate 64 is the output 168 of a free-running clock 66. The frequency of the clock is selected to correspond to the frequency at which it is desired that the stored count of the up/down counter 48 be adjusted. For this purpose, the frequency of clock 66 may be relatively slow, as much as two orders of magnitude lower than the master clock for the system.

If there is no document in the sensing station, as evidenced by a high level signal on line 170, the AND gate 64 will be open to pass through the output of the clock 66. Each pulse of the clock will pass through OR gate 50 onto line 152 as input to the AND gates 44 and 46. As previously discussed, only one of the AND gates 44 and 46 will be open at any one time to communicate the clock pulse to the up/down counter 48. More specifically, if the signal level at node 144 is high, AND gate 44 will be open to communicate the clock pulse on line 148 to the UP input of the counter. Alternatively, if the signal level at node 144 is low, AND gate 46 will be open to communicate the clock pulse on line 150 to the DOWN input of the counter.

It will be observed that the stored count on up/down counter 48 cannot be adjusted whenever there is a document in the sensing station. Specifically, the presence of a document in the sensing station will provide a low signal on line 170 and close AND gate 64 to the output of the clock 66. This interlock feature protects against adjustment of the stored count in the event of a document jam within the sensing station. A document jam may otherwise indicate that the intensity of the LED is low, and cause the circuit to attempt to adjust the stored count on the counter 48 to its upward limit to drive up the LED intensity.

The stored count of the up/down counter 48 is output in digital form on lines 172 into a digital-to-analog (D/A) converter 70. The D/A converter translates the stored count into a corresponding analog signal on line 74. This analog signal is input to a buffer amplifier 72 that interfaces the D/A converter 70 to the LED 14. The output 176 of the buffer amplifier 72 is provided to drive the LED 14 in relation to the stored count on the up/down counter 48.

The invention has been described in an illustrative manner, and it is to be understood that the terminology which has been used is intended to be in the nature of words and description rather than of limitation.

Obviously, many modifications and variations in the present invention are possible in light of the above teachings. It is therefore to be understood that within the scope of the appended claims, the invention may be practiced otherwise than as specifically described.

The embodiments of the invention in which an exclusive property or privilege is claimed are defined as follows:

1. A self regulating beam-of-light sensor device for sensing the presence of an object in a sensing station comprising:

a light source having its output directed at the sensing station;

phototransducer means, disposed in aligned relationship with said light source and responsive to the output thereof, for developing a detection signal in accordance with the presence of an object in the sensing station;

first comparator means for comparing the detection signal with a first reference signal level and outputting a signal representing the presence of an object when the detection signal exceeds the first reference signal;

second comparator means for comparing the detection signal with a second reference signal level and outputting a count signal of a first level if the second reference signal exceeds the detection signal, and of a second level if the detection signal exceeds the second reference signal;

counter means for storing an adjustable count having a proportional relationship to the intensity of the output of the light source;

feedback means, responsive to the stored count of the counter means, for energizing the light source in proportion to the stored count;

clock means for outputting a stream of periodic clock pulses; and gating means for adjusting the stored count upward or downward for each clock pulse in accordance with the output signal level of the second comparator means.

2. The device as defined in claim 1, further comprising disabling means for disabling the output of the clock means whenever the first comparator means outputs a signal representing the presence of an object in the sensing station.

3. The device as defined in claim 2, wherein the disabling means is defined to include logic gate means, having as a first input the output of the clock means and a second input, the output of the first comparator means, for gating through the output of the clock means only if the output of the first comparator means signifies there is no object in the sensing station.

4. The device as defined in claim 1, further comprising filter means for filtering out interruptions in the detection signal below a predetermined minimum time duration.

5. The device as defined in claim 4, wherein the filter means is defined to include delay counter means, responsive to an interruption in the detection signal, for counting the duration of the interruption in predetermined clock units and filtering out the interruption if its duration is below a minimum number of clock pulses.

6. The device as defined in claim 1, wherein the feedback means is defined to include digitial-to-analog (D/A) converter means.

7. The device as defined in claim 6, further including buffer amplifier means, responsive to the analog output of the D/A converter means, for driving the light source in accordance with said analog output.

8. The device as defined in claim 1, further including initializer means for initializing the stored count of the counter means.

9. The device as defined in claim 8, wherein the initializer means is defined to include an electrical energization source characterized by a relatively short rise time, a resistive-capacitive network, energizable by the source, and characterized by a relatively longer time constant, a source of master clock pulses, and means for gating the master clock pulses to the counter means for a time interval related to the time difference between the time constant of the network and rise time of the energization source.

10. The device as defined in claim 1, wherein the gating means are defined to include first and second AND gates, each gate having first and second inputs, wherein the first input of each AND gate receives the output of the clock means, and the second input of the first and second gates is the inverted and asserted representation of the count signal, respectively, the first gate being enabled to provide a count down pulse to the counter means if the count signal is of the first level, and the second gate being enabled to provide a count up pulse to the counter means if the count signal is of the second level.

* * * * *